Jan. 31, 1967 G. DE COYE DE CASTELET 3,301,085

ELECTRONIC GEAR-CHANGE CONTROL DEVICE FOR MOTOR VEHICLES

Filed Dec. 24, 1964

United States Patent Office 3,301,085
Patented Jan. 31, 1967

3,301,085
ELECTRONIC GEAR-CHANGE CONTROL DEVICE FOR MOTOR VEHICLES

Gaëtan de Coye de Castelet, Billancourt, France, assignor to Regie Nationale des Usines Renault, Billancourt, France, a French works under the control and the authority of the French government
Filed Dec. 24, 1964, Ser. No. 420,909
Claims priority, application France, Dec. 31, 1963, 958,991, Patent 1,388,904
5 Claims. (Cl. 74—472)

This invention relates to an electronic gear-change control device for motor vehicles, of the type comprising means for producing an electric current whose voltage is variable as a function of at least the speed of the vehicle, co-operating with a circuit which includes threshold-type semiconductor amplifiers and comprises electric gear-changing means. It is desirable in such cases for said circuit with semiconductor amplifiers, which semiconductors may be transistors for instance, to respond to different voltage thresholds in order to introduce a voltage step between the requirements for engagement of a given gear ratio and the requirements for disenagegement thereof when changing down, such a step ensuring in particular clean and stable gear changes.

The present invention has for its principal object an electronic control device wherein stability in the gear changes is obtained in a simple manner by means of a static circuit, i.e. a circuit obviating any form of recourse to systems with travelling contacts.

Essentially, an electronic gear-changing device according to this invention is characterized in that said circuit with semiconductor amplifiers, which has a source of direct current, comprises a Zener diode providing a stabilized voltage in one portion of the circuit, a semiconductor amplifier to the base of which is applied said variable voltage controlling conductivity thereof, and a semiconductor amplifier device whose conductivity is dependent upon that of said amplifier, said semiconductor amplifier device having a collector circuit containing said electric gear-change control means, a lead being provided between the collector of said amplifier device and a point in said stabilized-voltage circuit portion whereby said electric control means and said Zener diode are parallel-connected into said collector circuit, said lead being cross-connected to the emitter circuit of said semiconductor amplifier and comprising, one on either side of the connection, two diodes whose conductive directions lead toward said circuit portion, and, leading away from said portion and said cross-connection respectively, two interconnected leads comprising at least one resistor parallel-connected with respect to said Zener diode in order that conductivity of said semiconductor amplifier be further dependent upon whether said electric control means are energized or not, whereby to obtain the desired step between the requirements for upward and downward gear changes, respectively.

Figure 1:
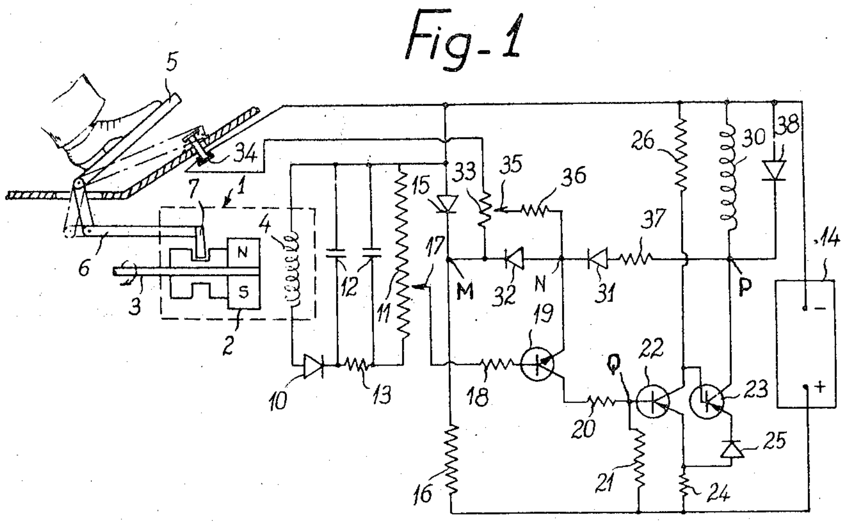
Figure 2:
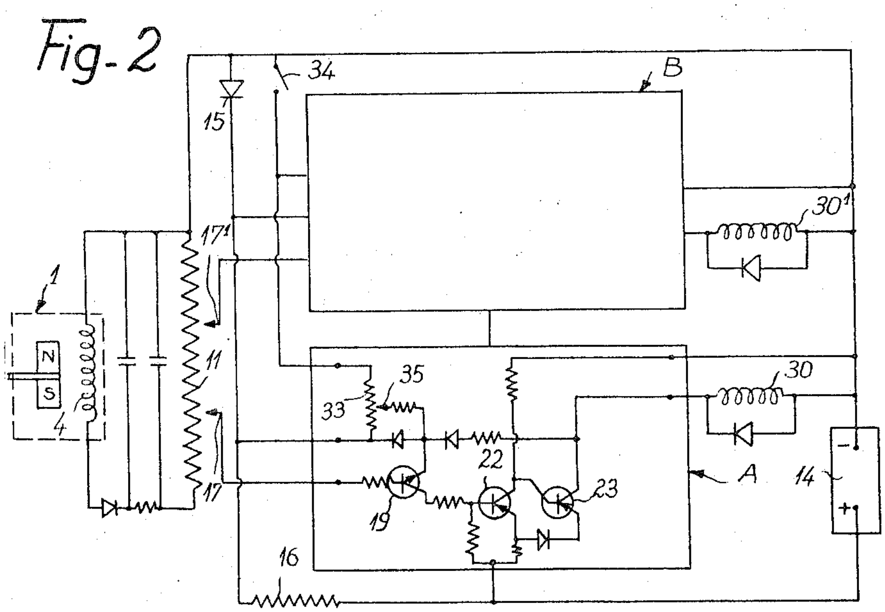

A form of embodiment on an electronic control device according to the invention will now be more particularly described by way of example with reference to the accompanying drawing, in which:

FIGURE 1 is a circuit diagram illustrative of the subject gear-changing control device of the invention, and FIGURE 2 is a control circuit diagram for cases involving several gear ratios.

In the accompanying drawing, reference numeral 1 designates an alternator whose rotor 2 is a rotating magnet driven by a shaft 3 connected, in a manner not shown, to the output shaft of the vehicle gearbox to be controlled, said alternator comprising a stator schematically represented by a coil 4, the voltage picked up across the terminals of which coil thus increases with increasing speed of the vehicle. Furthermore, the rotor 2 and the coil 4 can be displaced relatively to each other as a function of the position of the engine accelerator pedal 5, in this specific instance through a mechanical linkage 6 represented schematically between the pedal and the rotor and comprising a fork 7 pivotally engaging with said rotor which is movable axially through its case (not shown).

Such known means for relatively displacing the alternator rotor and stator permits obtaining, across the terminals of coil 4, a voltage which is additionally a function of the engine load factor and which, for a given speed, is all the lower as said load is higher, whereby gear changes, which are a function of the voltage produced by the alternator as will be seen from the operation of this control explained further below, are obtained in the manner well known per se at engine speeds which are all the higher as the load demand is itself higher.

Through a diode 10, coil 4 feeds a potentiometer 11 across which are parallel-connected voltage regulating capacitors 12, and this circuit further includes a temperature-compensating resistor 13 whose resistance increases with increasing temperature. To this circuit for energizing potentiometer 11 is associated a circuit comprising a direct-current source consisting of the customary vehicle battery 14, the terminals of which are connected to the two electrodes of a Zener diode 15, a resistor 16 being incorporated in this circuit and the circuit portion included between resistor 16 and diode 15 being kept at a voltage stabilized by said diode at a determinate fractional value of the battery voltage, for example at half-value.

Potentiometer 11 is connected at one end to the negative terminal of the battery and has its slider 17 connected through a resistor 18 to the base of a npn transistor 19 whose emitter is connected to a circuit portion the potential of which varies under conditions which will be explained hereinafter. The collector of said transistor is connected to the positive battery terminal through resistors 20 and 21, from between which a lead is run to the base of a pnp transistor 22 constituting one of the elements of a monostable trigger which comprises a further pnp transistor 23. The emitters of these transistors are connected to the positive battery terminal through a common resistor 24, and the emitter circuit of transistor 23 comprises a diode 25 adapted to compensate for the waste potential of transistor 22 when the same is conductive. The collector of transistor 22 is connected to the negative battery terminal through a resistor 26 and also to the base of transistor 23. The collector of transistor 23 is connected to the negative battery terminal through a winding 30 constituting the electric control means of the specific gear ratio, and this winding may be an electromagnet, clutch or electromagnetic brake winding, or else the winding of a servo-mechanism control relay. The winding 30 and the Zener diode 15 are parallel-connected into the collector circuit of transistor 23 by means of a lead provided between the collector of transistor 23 (point P) and a point M of said stable-voltage circuit portion. This lead is cross-connected at the point N to the emitter circuit of transistor 19 and comprises, one on each side of the point N, two diodes 31 and 32 which are conductive toward M. A potentiometer 33 connects said stable-voltage circuit portion to the negative battery terminal through a switch 34 whose function will be described hereinafter, and the slider 35 of potentiometer 33 is connected to the point N through a resistor 36.

A gear-changing control device as hereinbefore described is applicable to any gearbox gear ratio save bottom starting gear, which can be engaged in any known manner, for example by means of forward or reverse selection means at the driver's disposal, an automatic clutch responsive to engine speed being incorporated in the transmission.

The manner of operation of such a control device will be described hereinbelow assuming the vehicle to be under way regardless of the way in which it was started, the winding 30 being assumed, for example, to control the change from bottom gear to second gear. As long as the output voltage from potentiometer 11, which increases as the speed of the vehicle increases, remains below the threshold required to render transistor 19 conductive (the value of the initial potential at N being defined later), then for just so long as transistor 19 remains non-conductive the transistor 22 will likewise be non-conductive, whereas transistor 23 will be conductive and cause the winding 30 to be energized, it being important to note that the corresponding gear ratio is not engaged under such conditions, i.e. that it will be engaged only when said winding ceases to be energized. The result of initially energizing the winding 30 through the medium of transistor 23 is that the voltage drop in resistor 24 reverses the polarity of transistor 22, while the potential at the point P, taking into account the voltage drop in resistor 24, diode 25 and transistor 23, is substantially equal in effect to the positive potential of battery 14. Since the potential at the point P is thus caused to be greater than that at the point M of said circuit portion, whose voltage is stabilized by Zener diode 15, the current passing through transistor 23 flows through the winding 30 and also through resistor 37 and diodes 31 and 32 toward the Zener diode. The potential at the point N is therefore greater than that at M by the value of the voltage drop through the diode 32, and this is true almost regardless of the position of the slider 35 of potentiometer 33, due to the presence of the resistor 36 in series with said slider. It should be noted in this connection that the circuit portion PNM carries a current notably larger than that which can be carried by the transistor 19 even when it is conductive. When the potential of slider 17 of potentiometer 11 is greater than that of M, increased by the voltage drop through the diode 32 and the base-emitter threshold of transistor 19, the latter becomes conductive, and when, therefore, as a result of the presence of the polarizing resistor 21, the potential at the point Q drops to the conductivity threshold of transistor 22, the latter becomes conductive and consequently blocks the transistor 23. The base of transistor 23 thereby becomes less negative than previously, causing the winding 30 to cease to be energized, which in turn produces engagement of the corresponding gear ratio, as explained precedingly. The diode 38 in this case prevents overvoltages across the terminals of winding 30 when the current therethrough is cut off. The transistor 23 having become non-conductive, the potential at the point P tends to revert to the negative potential of the battery, that is to say that it becomes more negative than the potential at M but that, due to the presence of diodes 32 and 31, no current flows between these points. The potential at the point N is under such conditions substantially equal to that of the slider 35 of potentiometer 33, allowing for the fact that the relatively small collector current of transistor 19 causes only a small voltage drop in the resistor 36. The potential of slider 35 being manifestly lower than that of the point M (stabilized voltage), the result (as compared to the conditions existing previously to engagement of the considered gear ratio, in which the potential at N is conversely slightly greater than that at M) is that the base-emitter conductivity threshold of transistor 19 is lowered; that is to say that the change to the gear ratio below that previously engaged, which will be triggered when transistor 19 becomes non-conductive (through de-energizing the winding 30), will be caused to take place at engine speeds lower than that corresponding to an upward gear change, thereby ensuring clean and stable gear changes, as stated in the preamble to the present description.

The extent of the gap between the conditions corresponding to engagement and relinquishing of a given gear ratio can be adjusted by moving the slider of potentiometer 33, while the slider 17 of potentiometer 11 may be used to set the actual requirements for engaging the gear ratio considered.

It is furthermore preferable for said gap to be modifiable by increasing the engine speed at which downward gear changes are made in cases where the driver presses hard on the accelerator pedal in order to thereby obtain quicker gear changes from the gearbox.

This requirement is fulfilled by means of the switch 34 which is adapted to open when the accelerator pedal is fully depressed. When switch 34 is open and the gear ratio corresponding to deenergizing of winding 30 is engaged, the potential of the slider 35 of potentiometer 33 is no longer dependent upon the setting of the latter but tends to become equal to the potential at the point M, whereby the effective engine speed requirement for a downward gear change is notably higher and becomes very close to that required for engaging the gear ratio considered. The presence of a resistor (not shown) paralleled across the switch 34 would permit adjustment to engine speed requirements intermediate the two referred to, with the downward change taking place when the accelerator pedal is fully depressed.

FIGURE 2 shows an embodiment of such an electronic device for cases where several gear ratios are involved, an example being three. Such a device comprises two stages A and B for controlling gear changes other than bottom gear engagement. In addition to the alternator 1 and its circuit for energizing the potentiometer 11, the control stages A and B may have in common the circuit comprising the battery 14 and the Zener diode 15 with the resistor 16 series-connected thereto, and also the limit switch 34, the circuitry described precedingly being then applicable to the stage A.

The embodiment shown in FIGURE 2 would be suitable, for instance, for controlling an epicyclic gearbox in which the first gear ratio above bottom gear is controlled by the stage A (the winding 30 being energized responsively to the voltage taken from the slider 17) and the subsequent gear ratio controlled by the stage B (the winding 30$^1$ being energized responsively to the voltage taken from the slider 17$^1$), the control provided by the stage A being upheld during the change to the gear ratio of stage B.

It is, of course, to be understood that the subject device of the present invention is likewise applicable for controlling gear changes in other types of gearbox, an example being sliding-gear gearboxes, subject to means being provided for disengaging the previously engaged gear ratio prior to effectively engaging a new gear ratio, and this requirement can be met in any convenient manner falling outside the scope of the present invention.

I claim:

1. An electronic gear-change control device for motor vehicles, comprising means for producing an electric current whose voltage is variable as a function at least of the speed of the vehicle and a circuit having therein threshold-type semiconductor amplifiers and comprising electric gear change control means, characterized in that said circuit, which includes a source of direct current, comprises a first Zener diode providing a stabilized voltage in one portion of the circuit, a semiconductor amplifier to the base of which is applied said variable voltage controlling conductivity thereof, and a second semiconductor amplifier whose conductivity is dependent upon that of said first amplifier, said second semiconductor amplifier having a collector circuit containing said electric gear-change control means, a lead being provided between the collector of said second amplifier and a point in said stabilized-voltage circuit portion whereby said electric control means and said Zener diode are parallel-connected into said collector circuit, said lead being cross-connected to the emitter circuit of said first semiconductor amplifier and comprising, one on either side of the connection, two diodes whose conductive directions lead toward said stabilized circuit portion, and, leading away from said stabilized voltage circuit portion and said cross-connection respectively, two interconnected leads comprising at least one resistor parallel-connected with respect to said Zener diode in order that conductivity of said first semiconductor amplifier be further dependent upon the energization of said electric control means, whereby to obtain the desired step between the requirements for upward and downward gear changes, respectively.

2. An electronic gear-change control device according to claim 1, wherein said second semiconductor amplifier is part of a monostable trigger circuit comprising first and second transistors, the conductivity of the first transistor being dependent upon conductivity in said first amplifier responsive to said variable voltage and the second transistor being normally conductive when said direct-current voltage circuit is energized, said electric control means being connected into the collector circuit of said second transistor.

3. An electronic gear-change control device according to claim 1, wherein said two interconnected leads comprise in common a switch which opens when the engine accelerator pedal is fully depressed.

4. An electronic gear-change control device according to claim 1, wherein said resistor is a potentiometer whose slider is connected to said cross-connection through a further resistor.

5. An electronic gear-change control device according to claim 1, wherein the means for producing the electric current of variable voltage is an alternator whose rotor is driven at a speed dependent upon the speed of the vehicle and whose rotor and stator are adapted to be movable relatively to each other as a function of the engine accelerator pedal whereby to cause said voltage to vary with the engine load.

References Cited by the Examiner

UNITED STATES PATENTS

| | | | |
|---|---|---|---|
| 3,122,940 | 3/1964 | Shimwell et al. | 74—472 |
| 3,124,693 | 3/1964 | Peras | 74—365 X |
| 3,126,989 | 3/1964 | Baumann | 74—365 X |

DAVID J. WILLIAMOWSKY, *Primary Examiner.*

L. H. GERIN, *Assistant Examiner.*